United States Patent [19]

Smith et al.

[11] 4,415,993

[45] Nov. 15, 1983

[54] FAST ACCESS NON-VOLATILE MEMORY

[75] Inventors: Philip C. Smith, Columbia; John L. Fagan, Pasadena, both of Md.

[73] Assignee: The United States of America as represented by the Secretary of the Air Force, Washington, D.C.

[21] Appl. No.: 324,349

[22] Filed: Nov. 23, 1981

[51] Int. Cl.³ ............................................. G11C 13/00
[52] U.S. Cl. ................................... 365/184; 365/226
[58] Field of Search ............... 365/174, 184, 189, 226, 365/230, 227

[56] References Cited

U.S. PATENT DOCUMENTS 4,360,900 11/1982 Bate ..................................... 365/184

Primary Examiner—Terrell W. Fears
Attorney, Agent, or Firm—Donald J. Singer; William Stepanishen

[57] ABSTRACT

A memory apparatus having a row and column decoder for controlling the read and write function to a transistor memory pair. A single power/chip select pad is utilized to both power the memory and select the memory chip. External control signals are applied directly to critical internal node within the memory apparatus.

6 Claims, 2 Drawing Figures

FAST ACCESS NON-VOLATILE MEMORY

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to semiconductor memory devices, and in particular to a fast access non-volatile MNOS memory apparatus.

In memory circuits utilizing variable threshold devices, such as MNOS transistors, the threshold value at which the transistor conducts may be controlled by having a low threshold level to supply a logic or binary "one", and by having a high threshold level to supply a logic or binary "zero". In such circuits, it is desirable to have a short write cycle time to enable fast writing of data into the memory cell as well as reading data out. In a prior art MNOS memory circuit, data may be written into the memory cell over and over. In other words, the memory cell may be written as a binary one for a number of times in a row before a binary zero is written. This causes the variable threshold transistor to shift its threshold between high and low to the maximum extent during the write cycle which saturates the device to a condition, which may be referred to as the saturated threshold state. Thus, when it is desired to write a binary level of the opposite state into the memory cell, the write pulse must have adequate polarizing voltage and time to shift the threshold voltage of the transistor from the previous saturated state. To speed up the time of writing a binary level or shifting the voltage in a variable threshold transistor such as an MNOS transistor, the voltage or electric field across the gate insulator of the device is increased by increasing the polarization voltage. Unfortunately, these high electric fields across the gate insulator of the MNOS device during the write cycle serve to accelerate the undesirable endurance phenomena creating a smaller threshold voltage and decreased retention time of the memory state.

SUMMARY OF THE INVENTION

The present invention utilizes buffers to drive column and row decoders which select a transistor memory pair in a conventional X-Y decode arrangement. The chip select function is combined in a single power/chip select signal that is applied to a single pin on a chip whereby access time is increased and power consumption is reduced. A reset transistor is utilized to pre-charge the row decode structure thereby lowering the junction capacitance therein and speeding memory access time.

It is one object of the present invention, therefore, to provide an improved fast access non-volatile memory apparatus.

It is another object of the invention to provide an improved fast access non-volatile memory apparatus utilizing a single pin to provide the power/chip select function.

It is another object of the invention to provide an improved fast access non-volatile memory apparatus wherein the standby power for a chip is zero.

It is still another object of the invention to provide an improved fast access non-volatile memory apparatus wherein critical internal nodes are driven directly from the pins to eliminate buffering thereby saving time and power.

It is yet another object of the invention to provide an improved fast access non-volatile memory apparatus wherein a reset unit is utilized to permit pre-charging of the row decode structure thereby lowering junction capacitance and permitting faster access speeds.

These are other advantages, objects and features of the invention will become more apparent after considering the following description taken in conjunction with the illustrative embodiment in the accompanying drawings.

DESCRIPTION OF THE PREFERRED EMBODIMENT

Figure 1:
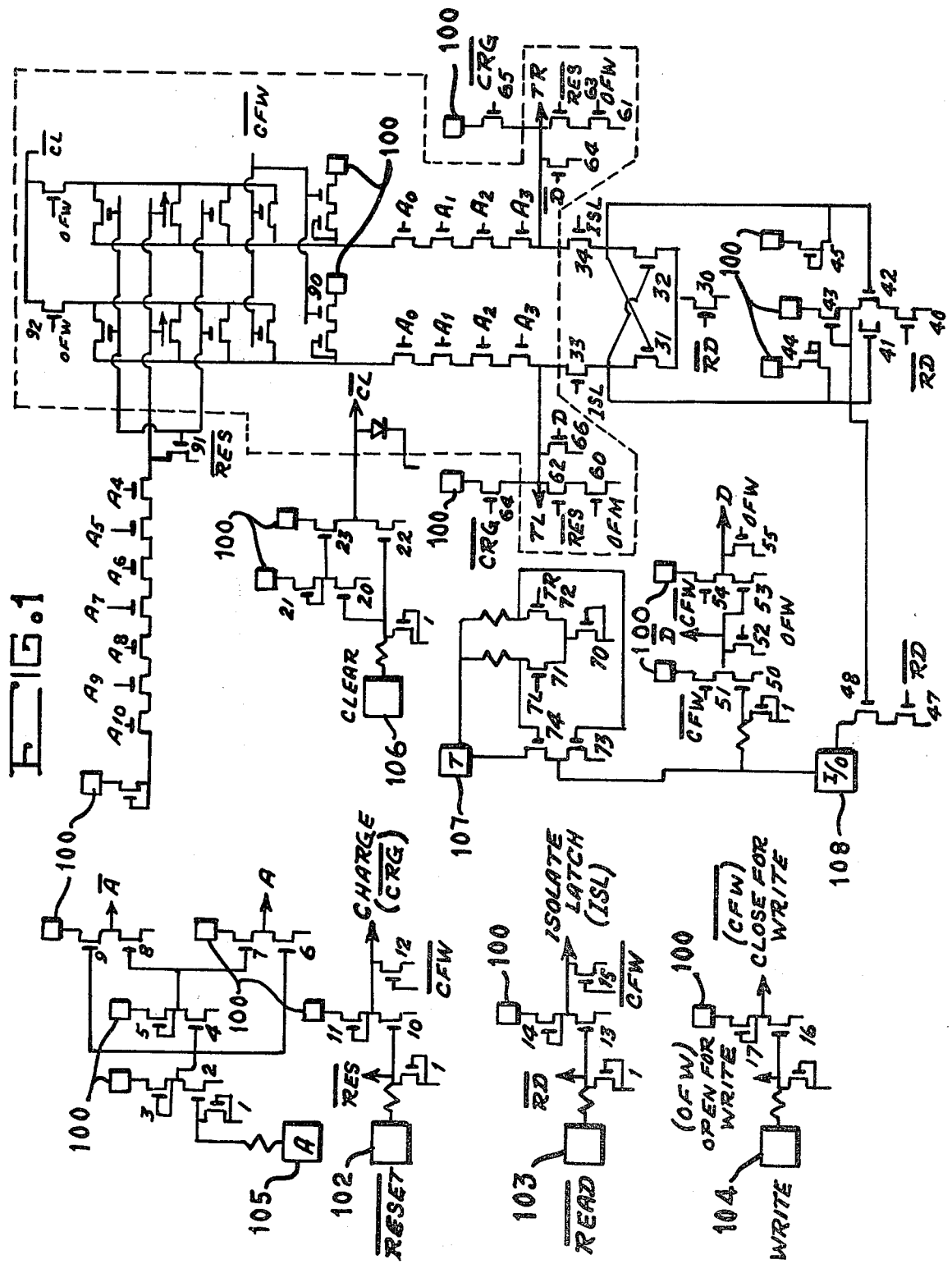
FIG. 1 is a schematic diagram of the fast access non-volatile memory apparatus according to the present invention; and, FIG. 2 is a graphical representation of signal waveforms within the memory apparatus.
Figure 2:
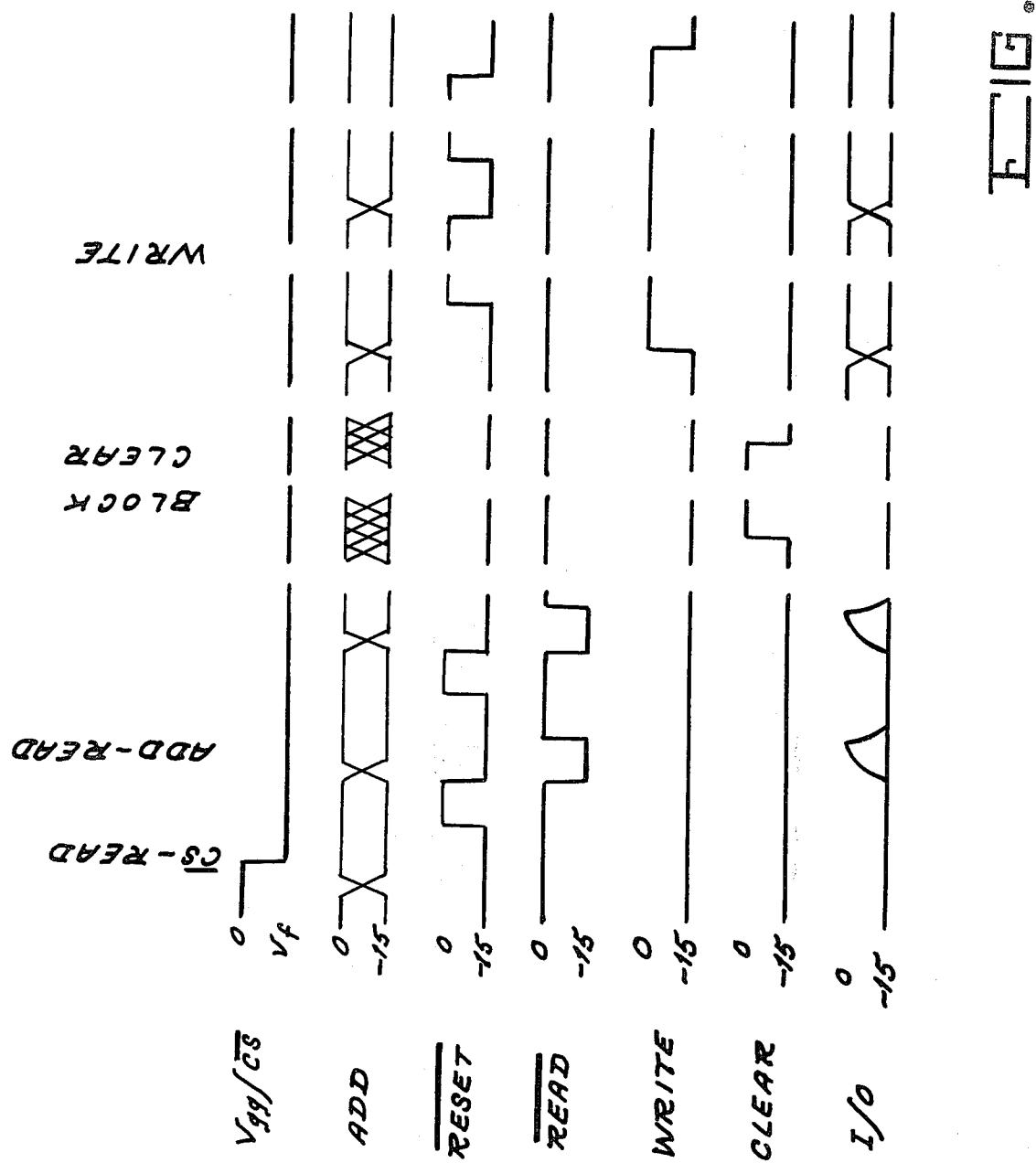

Referring now to FIG. 1, there is shown a fast access non-volatile MNOS memory apparatus wherein the access time is typical about 150 nanoseconds. The small squares 100 at the top of inverters represents the input terminal or pad for the signal $V_{gg}/\overline{CS}$ which is the combined power-chip select pin. While these squares 100 are shown in the schematic as separate individual squares, it should be well understood that on an actual semiconductor chip, these squares 100 are single layer or entity. When the part is deselected the power/chip select signal, $V_{gg}/\overline{CS}$ which as shown in FIG. 2 may vary between zero volts and $V_T$ (approximately minus fifteen volts) is set at zero volts and thereby this input pad is at ground and no supply voltage exists anywhere on the chip. This is a highly desirable condition since the power dissipation is zero and the radiation tolerance is thereby maximized. It should also be well understood that all blank or unlabelled FET connections are terminated to a common substrate which is held at the most positive voltage in the system. The A pad 105 is the A signal input pad through which signals A1–A10 are inputted to the address buffers and thereby used internally on the chip.

The second point to note in FIG. 1 is that the three control pads (Reset, Read and Write) 102, 103, 104 drive many internal gates directly after the gate input protect network. This generally represents a large capacitance ($2_pF$) if it must be driven by on chip circuits however it is insignificant to a buffer that is driving an array of chips in a memory system. The net result is that internal control nodes may be switched on and off very fast by external drivers. It is also still possible to bus control lines in a system since the chip select function is utilized to turn the power off or on. Although internal nodes on deselected chips are receiving input signals, no action occurs since no power exists.

Turning now to FIGS. 1 and 2, the fast access non-volatile MNOS memory apparatus operates in the following manner. The following external and internal operations take place during the operation of reading data. The $V_{gg}/\overline{CS}$ pin 100 switches to $-15V$ level for selecting and powering the chip. All signal levels and timing are shown in FIG. 2 for the various operational functions of a memory chip. The address buffers (transistors 2 thru 9) generate the true and compliment values using driven depletion loads 7 and 9 to improve speed. The buffers 2–9 drive column decoders (A0 thru A3) and row decoders (A4 thru A10) to select a pair of transistors in the memory array of a conventional X-Y decode scheme. The present example illustrates the use of a 2K address space but the extension of this invention to other memory sizes is easily achieved. The Reset input 103 is at a −15V level thereby holding devices 62, 63 and 91 on. The Reset signal, by these means, provides a ground to the selected row and grounds the selected column and the detection latch units 31, 32. The device A4 is utilized to drop about half of the supply voltage that is supplied by the depletion load at device A10. This causes a significant voltage to appear along the string decode device A10 to A5. The P-N junctions which are associated with these transistors are reverse biased, thereby reducing their capacitance and giving the various nodes a head start in charging the selected row. This occurs next when $\overline{\text{Reset}}$ signal switches to zero volts thereby turning off devices 91 and 62, 63. In addition, devices 10, 11 generate a charge signal which powers devices 64, 65 thereby causing the selected column to charge. The two memory transistors (shown with arrows on the gates) which are utilized to form a bit, have previously been set such that one is written to a threshold of −10V and the other is cleared to a threshold of −2V. When the gate line reaches −2V, the cleared transistor conductors and discharges the column to ground via devices 92 and 22. The other column continues to charge. After a sufficient difference exists (>.1V) to set the latch devices 31, 32, the $\overline{\text{Read}}$ input 103 switches to a −15V level thereby turning on device 30. Devices 45 and 46 pull the latch to full supply voltage. Device 42 turns on, turning off device 48 if the data is a "1", and device 43 pulls device 48 on if data is a "0". The signal ISL is generated by devices 13, 14 to turn off devices 33, 34 and thereby greatly reduce the capacitance the latch unit must switch. This completes the read cycle. Note that when devices 33, 34 turn off isolating the latch unit, the $\overline{\text{Reset}}$ signal can switch to the −15V level and thus the next bit can be addressed while the latch unit sets.

The manner in which the memory transistors are set to the cleared and the written states will be discussed in the following sections. The transistors 20 thru 23 form a conventional push-pull buffer apparatus. The clear signal which is shown at pad 106 is normally at the −15V level to hold device 22 on and to clamp the memory epi ($\overline{\text{Cl}'}$) to the circuit ground. When clearing is desired, the clear signal rises to zero volts thereby turning device 22 off and device 23 on. Device 91 is on so all gates are at ground and device 23 pulls the epi toward Vgg/$\overline{\text{CS}}$ which is a −30V signal for clearing and writing. The memory transistors are all reset to a −2V threshold by the tunneling of charge in the MNOS structure. A bit cannot be written by supplying an address and data. The write signal input 104 switches to zero volts to generate the $\overline{\text{CFW}}$ signal at the output of devices 16, 17. Transistors 50 thru 55 generate the data and its compliment which drives either device 66 or device 67 on. Device 15 holds devices 33, 34 off. Device 90 turns on with the $\overline{\text{CFW}}$ signal and charges the column line that is not held to ground by device 66 or 67. It also charges all other column lines that are not addressed by buffers A0 thru A3. The next operation switches all other column lines that are not addressed by buffers A0 thru A3. The next operation swtiches the $\overline{\text{Reset}}$ signal to ground thus allowing the selected row to charge. The MNOS transistor with the column line at ground and gate charged will write to a threshold of about −10V. The transistor with gate and column charged does not change. In this manner, each bit pair is written with the desired data.

The charge stored in a MNOS structure decays with time in a complex function of temperature and device history. It is, therefore, highly desirable to be able to determine the difference in the cleared and written transistors threshold for each bit. In this way, the parts can be tested for abnormal bits. Transistors 70 and 74 accomplish this in a novel manner. The T pad 104 supplies a voltage when testing is desired. The L/O pad 108 provides the test data. To perform a test, a read cycle is done but the $\overline{\text{Read}}$ signal remains high. When the $\overline{\text{Reset}}$ signal switches to ground, the voltage at TL minus the voltage at TR is the window value of interest. This is the data driving the latch unit. It is supplied to the gates of devices 71, 72 which must share a specific current set by the current source device 70. If TL is discharged by the memory transistor, device 71 will conduct less than device 72. Since the current is fixed by device 70, the voltage to device 74 moves toward the voltage at the T pad 107 as the current thru the associated resistor falls. Device 73 is being driven in the opposite direction. Transistors 73 and 74 are designed such that when TL and TR are at ground and I/O pad 108 resets at T/2 volts. By observing the voltage at the I/O pad 108 during the read cycle, an analog representation of the memory window is obtained.

Although the invention has been described with reference to a particular embodiment, it will be understood to those skilled in the art that the invention is capable of a variety of alternative embodiments within the spirit and scope of the appended claims.

What is claimed is:

1. A fast access non-volatile memory apparatus comprising in combination:

a memory means to store a digital bit, a row decode means operatively connected to said memory means, a column decode means operatively connected to said memory means, said row decode means and said column decode means cooperating with each other to write and read data into and from said memory means, a data input means to receive input data, said data input means providing data signals to said row decode means and said column decode means, a latch means connected to said column decode menas to activate said column decode means, a reset means to receive a reset signal, said reset means providing said reset signal to said memory means and said row decode means, a read means to receive a read signal, said read means providing said read signal to said latch means, said read means generating an isolate latch signal, said read means applying said isolate latch signal to said latch means, a write means to receive a write signal, said write means generating a first and second write signal, said write means applying said first and second write signal to said memory means, a clear means to receive a clear signal, said clear means providing said clear signal to said memory means to clear said memory means, and an input/output means connected to said latch means, said latch means during a read cycle turning said input/output means off if said memory means digital bit is a logical one, and pulling said input/output means on if said memory means digital bit is a logical zero, said input/output means providing said digital bit as an output.

2. A memory apparatus as described in claim 1 wherein said row decode means comprises a plurality of buffer units in series.

3. A memory apparatus as described in claim 1 wherein said column decode means comprises two or more columns of buffer units in series.

4. A memory apparatus as described in claim 1 wherein said memory means comprises a pair of memory transistors.

5. A memory apparatus as described in claim 1 further including charging means for controlling the output of said row decode means, said charging pre-charging said row decode means in response to said reset signal.

6. A memory apparatus as described in claim 1 further including a power/chip select means connected to each of said means which comprises said memory apparatus, said power/chip select means providing a power/chip select signal to said memory apparatus.

* * * * *